United States Patent [19]

Heck

[11] Patent Number: 5,548,840
[45] Date of Patent: Aug. 20, 1996

[54] BALANCED MIXER CIRCUIT WITH IMPROVED LINEARITY

[75] Inventor: Joseph P. Heck, Ft. Lauderdale, Fla.

[73] Assignee: Motorola, Inc., Schaumburg, Ill.

[21] Appl. No.: 219,813

[22] Filed: Mar. 28, 1994

Related U.S. Application Data

[63] Continuation of Ser. No. 829,828, Feb. 3, 1992, abandoned.

[51] Int. Cl.$^6$ ..................................................... H04B 1/26
[52] U.S. Cl. ........................ 455/326; 455/333; 327/358
[58] Field of Search ........................... 455/323, 325, 455/326, 327, 328, 332, 333, 305, 319; 307/529; 327/358, 359, 361

[56] References Cited

U.S. PATENT DOCUMENTS

| | | | |
|---|---|---|---|
| 3,641,441 | 2/1972 | Gunn et al. | 455/323 |
| 4,156,283 | 5/1979 | Gilbert | 327/359 |
| 4,458,210 | 7/1984 | Horl | 327/359 |
| 4,619,001 | 10/1986 | Kane | 455/326 X |
| 4,677,692 | 6/1987 | Sakashita et al. | 455/333 X |
| 4,695,940 | 9/1987 | Rein | 455/326 X |
| 4,727,597 | 2/1988 | Dautriche | 455/326 |
| 4,814,649 | 3/1989 | Young | 455/333 |
| 4,818,951 | 4/1989 | Roberts | 327/358 |
| 4,931,746 | 6/1990 | Tränkle et al. | 455/333 X |
| 5,060,298 | 10/1991 | Waugh et al. | 455/333 X |
| 5,107,150 | 4/1992 | Kimura | 307/529 |
| 5,302,868 | 4/1994 | Fergus | 327/359 |

OTHER PUBLICATIONS

Strembler, "Introduction to Communication Systems", Dec. 1982, p. 203.

*Primary Examiner*—Edward F. Urban
*Attorney, Agent, or Firm*—M. Mansour Ghomeshi

[57] ABSTRACT

A balanced mixer circuit includes a first balanced input (RF(+) and RF(−)), a second balanced input (LO(+) and LO(−)), and a balanced output (OUT+ and OUT−). The balanced mixer circuit also includes a mixer for mixing a first signal with a second signal. The mixer further includes a first input and second input which is coupled to the second input of the balanced mixer circuit. The balanced mixer circuit also includes a pair of couplers for coupling the first input of the mixer circuit to the first input of the mixer. Each of the pair of couplers includes a feedback circuit having a current source and an active component for improving the performance of the balanced mixer circuit.

9 Claims, 3 Drawing Sheets

BALANCED MIXER CIRCUIT WITH IMPROVED LINEARITY

This is a continuation of application Ser. No. 07/829,828, filed Feb. 3, 1992, and now abandoned.

TECHNICAL FIELD

This invention is generally related to radio communication devices and more specifically to mixers in radio communication devices.

BACKGROUND

Mixers are used in communication devices to down step or up step the frequency of their input signal. In receivers, mixers are utilized to mix a received signal with a locally generated reference or injection signal to produce a difference signal. This difference signal is further processed and demodulated according to a variety of demodulation schemes before being presented to a user. Mixers in general, and balanced mixers in particular, are well known in the art and have been used by radio designers extensively. A variety of balanced mixers are available. Some with one balanced port, others with two or three balanced ports. Doubly balanced mixers have two of their ports balanced. Triply balanced mixer have all three of their ports balanced. The advantages of balanced mixers include improved spurious response, improved noise degradation, simplicity of their matching networks, and so forth. Various topologies have been used in realizing mixer requirements. In general, however, a doubly balanced mixer includes a balanced or differential radio frequency (RF)input port and a balanced or differential local oscillator (LO)input port where each port accommodates a balanced signal to be mixed with the other. Integrated doubly balanced mixers are generally based on a structure known as Gilbert Cell. The Gilbert structure has limitations to its intermodulation (IM) distortion performance, noise figure, current drain performance, and a trade off amongst these three criteria. These limitations have limited the use of balanced mixers in communication devices with stringent performance requirements.

Referring to FIG. 1, a circuit diagram of a mixer 100 is shown utilizing presently known circuit topologies. The mixer 100 includes transistors 106, 108, 110, and 112 that are ultimately coupled to balanced local oscillator inputs LO(+) and LO(−). Coupled to these transistors are two input gates, transistors 114 and 116 which couple balanced radio frequency inputs RF(+) and RF(−). A balanced RF signal applied to the base of transistors 114 and 116 is switched at the rate of the local oscillator signals applied to transistors 106, 108, 110 and 112. The switching of the RF signal results in a signal appearing at the output Out (+) and Out (−) equal to the difference of the RF and LO signals. Two degeneration resistors 118 and 120 couple the emitters of transistors 114 and 116 to a current source shown by a transistor 122 and a resistor 124. The degeneration resistors 118 and 120 are used to provide improvements in the third order IM at the expense of some gain and noise figure. It can be Shown that the third order IM intercept point is given by the following equation:

$$IP3_{ildBm} = 10 + 20 \cdot \log(4V_T) + 30 \cdot \log\left\{1 + \frac{R_E \cdot I_{EE}}{4V_T}\right\} - 10 \cdot \log\left(\frac{Ri}{50}\right)$$

Where $V_T = kT/q$ $K = 1.38 \times 10^{-24}$ (Boltzman's Constant)

T=Kelvin Temperature $q = 1.6 \times 10^{-19}$ (Electron Charge)

Ri=RF port input impedance.

Since the gain of the mixer 100 is set essentially by the value of $R_E$ it can be concluded from the equation that with this circuit configuration of a given gain the only way to improve intercept point is to increase the current drain or to reduce Ri. Normally, input impedance is set by other criteria and cannot be changed or if it is changed will result in a no win shift in all performance parameter values. With high demands on performance improvements and reduced current consumption it can be seen that IM and noise figure can be limitedly improved at the cost of increased current drain. It is therefore desired to have a mixer circuit that has improved IM and noise figure performance without a significant increase in current drain.

SUMMARY OF THE INVENTION

Briefly, according to the invention, a mixer circuit having a first input, a second input, and an output is provided. The mixer circuit includes a mixing means for mixing a first signal with a second signal. The mixing means includes a first input and a second input which is coupled to the second input of the mixer circuit. The mixer circuit also includes a coupler means for coupling the first input of the mixer circuit to the first input of the mixer means. The coupling means includes a feedback circuit for improving the performance of the mixer circuit.

DETAILED DESCRIPTION OF THE PREFERRED EMBODIMENT

Radio communication designers are often plagued with having to design a mixer circuit that meets their device performance requirements without sacrificing other important parameters. In particular, the traditional methods of improving intermodulation (IM) performance of a balanced mixer result in noise figure degradation and/or an increase in the current drain. Other problems are observed as other parameters are tackled. This invention provides a mixer circuit that overcomes the negative inter-dependance of these parameters, e.g. better IM performance for a given level of current drain and gain.

Figure 1:
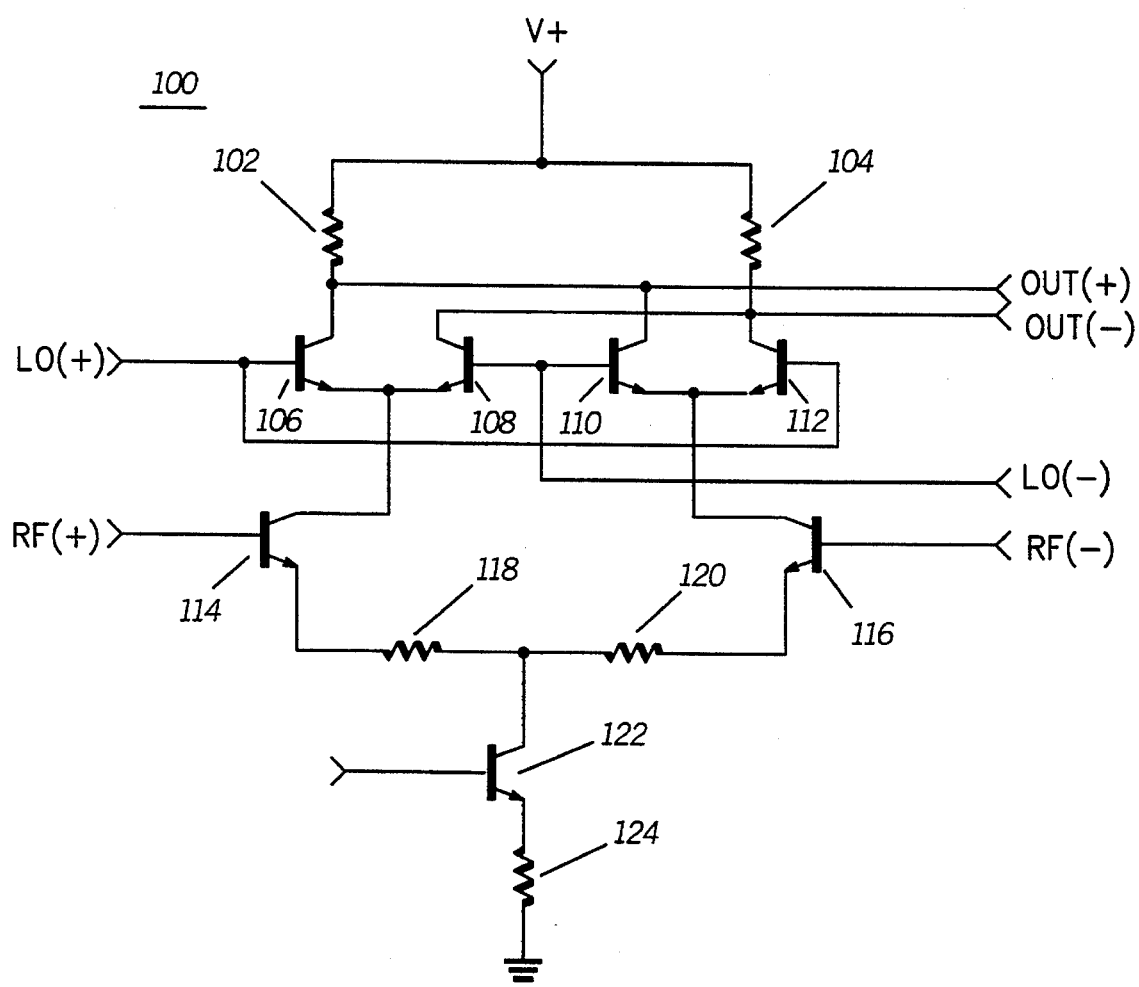
FIG. 1 shows a schematic diagram of a presently available mixer circuit.
Figure 2:
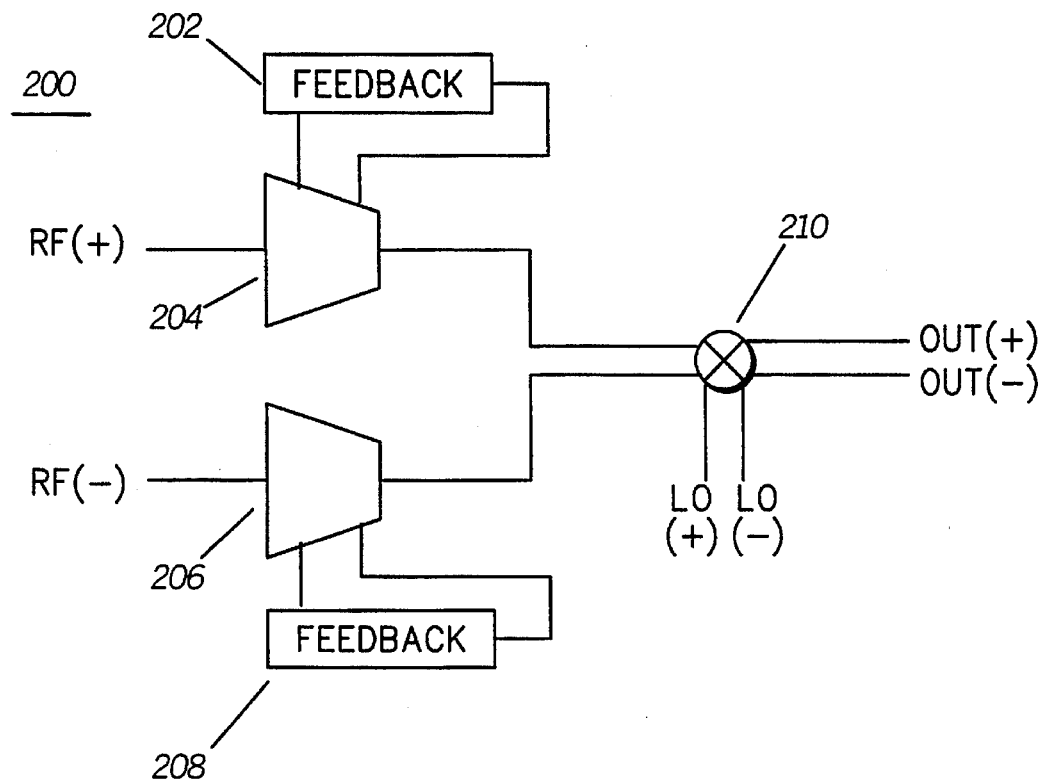
FIG. 2 shows a block diagram of a mixer in accordance with the present invention.

Referring to FIG. 2, a block diagram of a balanced mixer circuit 200 in accordance with the principles of the present invention is shown. The balanced mixer circuit 200 is a triply balanced mixer in that it includes a balanced pair of Radio Frequency (RF)inputs, RF(+) and RF(−), a balanced pair of local oscillator inputs, LO(+) and LO(−), and a balanced pair of outputs, OUT(+) and OUT(−). The two RF inputs are coupled to a balanced mixer 210 through a pair of amplifiers, preferably transconductance amplifiers 204 and 206. The transconductance amplifiers 204 and 206 amplify the voltage of the RF signals at RF(+) and RF(−), convert it to current, and then apply it to the mixer 210 at RF(+) and RF(−) inputs. These amplifiers include feedback circuits 202 and 208, respectively. The balanced RF signals are mixed with the local oscillator signals to produce output signals at OUT(+) and OUT(−). The elements of the feedback circuits 202 and 208 provide the means for reducing intermodulation without sacrificing noise figure or increasing current drain in the circuit of the mixer circuit 200.

Figure 3:
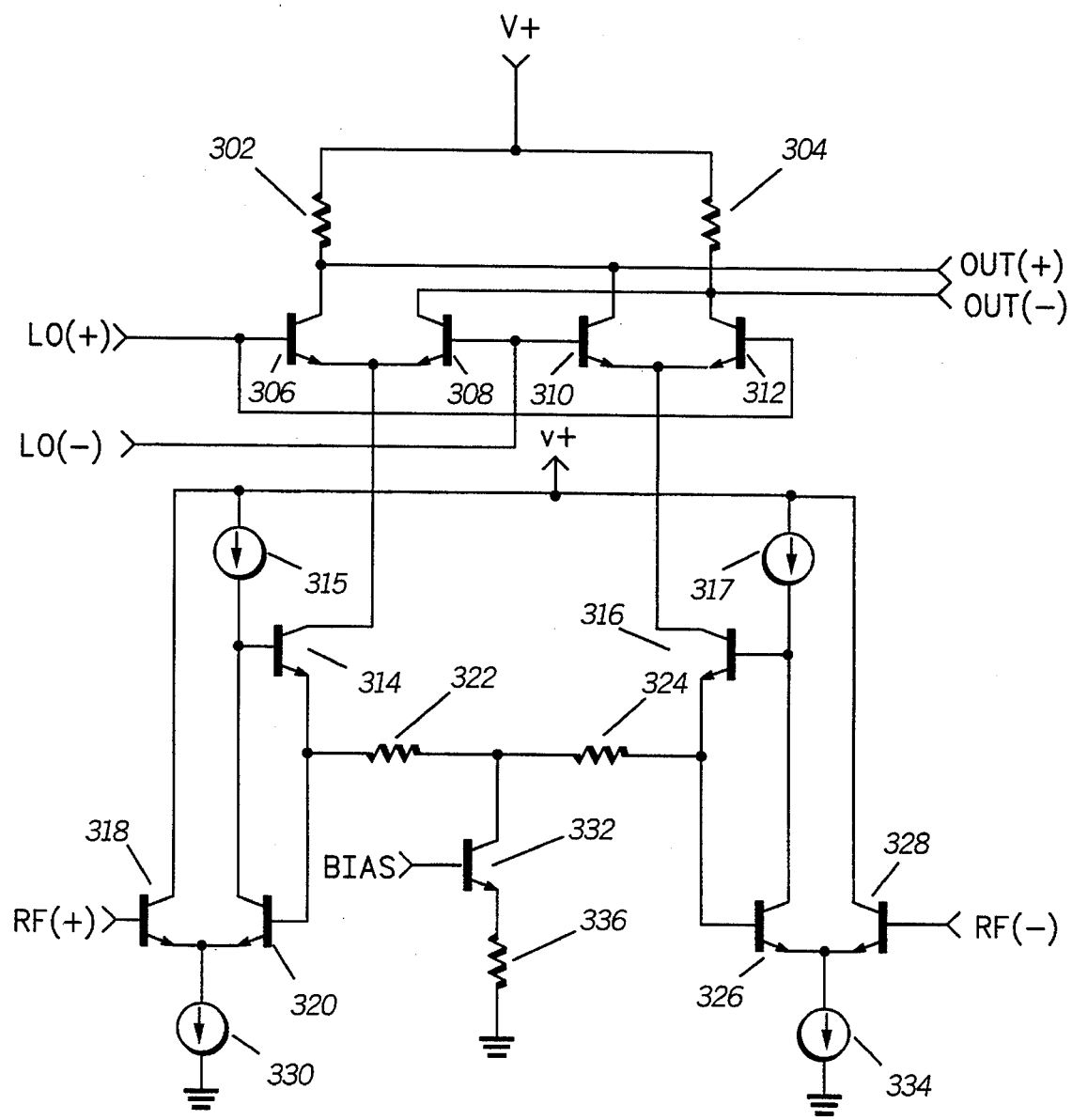
FIG. 3 shows a schematic diagram of a mixer in accordance with the present invention.

FIG. 3 shows a schematic diagram of the elements of the mixer circuit 200, in accordance with the present invention. To facilitate the understanding of the operation of the components of this figure, cross references are made to the block diagram of FIG. 2. The mixer circuit 200 includes transistors 306, 308, 310 and 312 which feed the output resistors 302 and 304. These transistors are the components of the mixer block 210, as shown in FIG. 2. The bases of the transistors 306 and 312 are combined to form the LO(+) input while the bases of transistors 308 and 310 are combined to form the LO(−). Collectors of transistors 306 and 310 are connected to form the first RF output, OUT(+). Similarly, the collectors of transistors 308 and 312 are coupled together to form the second RF output, OUT(−). The first RF input signal is coupled to the mixer 210 at the emitter junction of transistors 306 and 308. The transistor 314 forms a portion of the feedback loop 202. Transistors 318 and 320 and two current sources 315 and 330 constitute the transconductance amplifier 204. The current source 315 is also a part of the feedback loop 202. The base of the transistor 318 receives the RF(+) signal and converts it to current, before applying it to the emitter junction of transistors 306 and 308 through the feedback transistor 314. Similarly, transistors 326 and 328 in combination with current sources 317 and 334 constitute the second transconductance amplifier 206. A transistor 316, in conjunction with the current source 317, constitute the feedback 208. The output signal current of the transconductance amplifier 206 is available at the collector of the transistor 316. This signal is coupled to the mixer 210 at the emitter junction of transistors 310 and 312. The base of the transistor 328 is coupled to the RF (−) and receives an RF signal in the form of a voltage. Bias for the circuit 200 is applied to the base of a transistor 332, which is coupled to ground through an emitter resistor 336. It is well understood that the RF and LO inputs must be biased for the circuit 200 to properly operate. This bias may be provided via resistor divider circuits at these inputs. Alternatively, RF(−) and LO(−) may be connected simply to a DC bias voltage equal to the DC bias voltage at RF(+) and LO(+), respectively. Two degeneration resistors 322 and 324 couple the two transconductance amplifiers 204 and 206 to the current source formed by the biasing transistor 332 and resistor 336. These resistor values set the gain of the mixer and the degree of feedback.

A balanced RF signal, applied to RF(+) and RF(−), is converted to current before it is applied to the transistors 306, 308, 310 and 312. These transistors switch at the rate determined by the local oscillator LO(+) and LO(−). The switching of these transistors results in the signal at OUT(+) and OUT(−) to have the difference frequency of the frequency of RF signals and LO signals. The operation of the switching circuit comprising the mixer 210 is well known in the art. A detailed description of the operation of one such circuit is found in the "Analog Integrated Circuits for Communication Principles Simulation and Design" by Donald O. Peterson and Kartikeya Mayaram, published by Ruler Academic Publishers (1991).

Feedback paths comprising transistors 314 and 316 allow for a reduction in the intermodulation (IM) without compromising the noise figure or increasing the current drain. In other words, the circuit configuration of the mixer circuit 200 achieves a better trade-off amongst intercept point gain and noise figures. The improvement in performance is achieved by use of the feedback circuits 202 and 208 in place of single transistors at the RF(+) and the RF(−)inputs. The feedback circuit is an improvement in linearity, which results in improved IM performance. The gain of the mixer is virtually unchanged (indeed gain is slightly increased with the feedback circuit) and is set by the values of the emitter degeneration resistors 322 and 324. The noise figure of the circuit 200 has been found to be equal to or lower than the presently available mixers, such as mixer 100. The improvement in linearity decreases with increasing frequency of operation because the open loop gain of the feedback circuit rolls off with increasing frequency. Conversely, as current drain increases, the open loop gain and the linearity increase, and hence IM performance improves. In the preferred embodiment, the current sources 315 and 317 are set to produce currents equal to that produced by current sources 330 and 334. It is understood that the balanced nature of the circuit 200 demands that currents produced by sources 330, 334 be equal. Also, by varying the DC current magnitude produced by sources 330, 334 and the transistor 332, the IM performance can be programmed for different operating conditions or frequencies.

In summary, the mixer circuit 200 is shown to have realized improved IM performance along with improved gain and noise figure performances. By utilizing the feedback circuits 202 and 208 the transconductance amplifiers 204 and 206 can operate more linearly resulting in concurrent improvements of highly dependent parameters.

Figure 4:
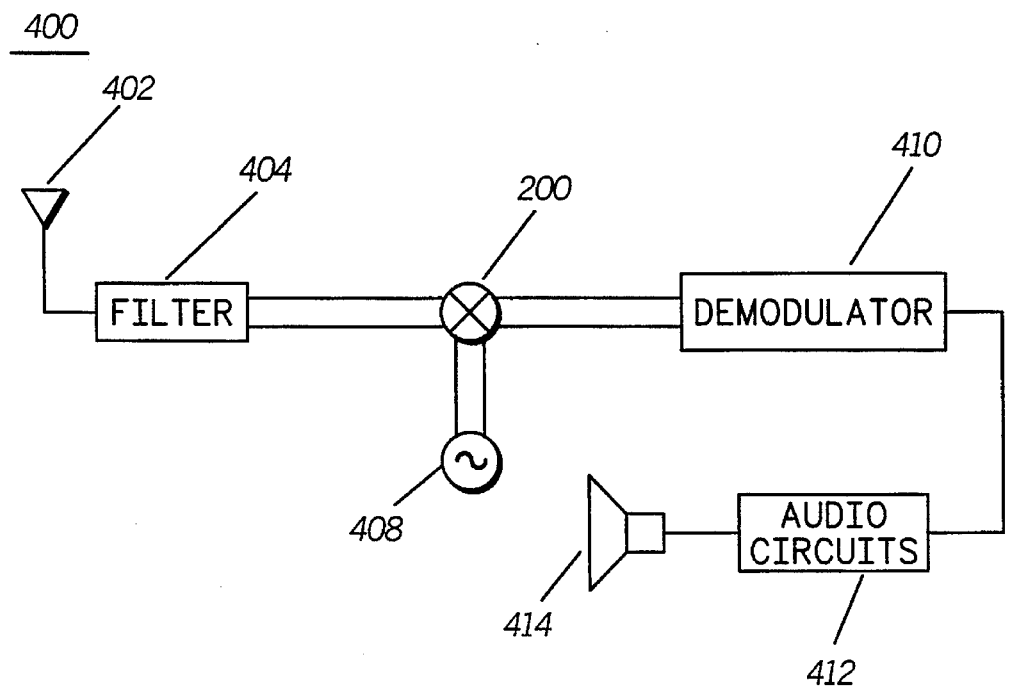
FIG. 4 shows a block diagram of a communication device in accordance with the present invention.

FIG. 4 is a block diagram of a communication device in accordance with the present invention. The device 400 includes an antenna 402 where RF signals are received and coupled to a filter 404. The filter 404 removes undesired components of the received signal before differentially applying it to the mixer circuit 200. The mixer circuit 200 receives its differential local oscillator signals from an oscillator 408 with balanced outputs. The balanced outputs of the mixer circuit 200 are either coupled to a demodulator 410, where the now-converted received signal is demodulated and decoded. The demodulator 410 includes such circuits as IF amplifiers and IF filters to amplify and filter the IF output signal of the mixer circuit 200. The demodulated signal of the demodulator 410 is applied to an audio circuit block 412, where it is processed before being presented to the user via a speaker 414. In addition to the audio circuit 412 and the speaker 414, a controller and a display may be used to present data signals to the user. Although the mixer circuit 200 is shown to be differential IN differential OUT, it is well understood that the principles of the present invention may be applied to mixers having differential inputs and single ended outputs, or single ended inputs and differential outputs, or single ended input and single ended output.

It is understood that the circuits 200 and 400 are intended to provide the preferred embodiments of the present invention and not limitations thereto. It is further understood that modifications to these circuits are possible without significant departure from the spirit of the invention. It is therefore the scope of the claims that should define the scope of the protection and not the specific embodiments presented here.

It can be seen that by employing a transconductance amplifier along with the feedback loop, the coupling of the RF input signal to the switching portion of the mixer allows for performance improvements in the areas not collectively possible. The use of the circuit 200 overcomes the deficiencies of the prior art in allowing the intermodulation to be improved along with noise performance and gain without significant increase in current drain. The circuit is particularly useful in portable communication devices where batteries are used as a main power source. In such devices, and in order to save valuable battery energy, it is highly desirable that any steps taken to reduce undesired interferences does not result in increased power consumption.

What is claimed is:

1. A balanced mixer circuit having a pair of differential inputs (RF+, RF−), the balanced mixer circuit comprising:

balanced mixer means having outputs (Out+, Out−) for differentially mixing a first differential radio frequency signal, received at a first pair of differential inputs (RF'+, RF'−), with a second differential local oscillator signal received at a second pair of differential inputs (LO+, LO−) to produce a differential output signal; and coupler means for coupling the pair of differential inputs (RF+, RF−) of the balanced mixer circuit to the first pair of differential inputs (RF'+, RF'−) of the balanced mixer means, the coupler means including a pair of transconductance amplifiers differentially coupled to each other, each amplifier having a feedback circuit containing a current source and an active component coupled to each of the pair of transconductance amplifiers for forcing the amplifiers to operate more linearly in order to improve intermodulation performance of the balanced mixer without degrading the noise figure.

2. The balanced mixer circuit of claim 1, further including a biasing means for biasing the coupler means and mixer means.

3. The balanced mixer circuit of claim 1, wherein the balanced mixer means includes a switching means for switching the first signal at a pre-determined rate.

4. The balanced mixer circuit of claim 1, wherein the coupler means includes a transconductance amplifier.

5. A balanced mixer circuit having outputs (out+, out−) for differentially mixing a first differential radio frequency signal, received at a first pair of differential inputs (RF+, RF−), with a second differential local oscillator signal received at a second pair of differential inputs (Lo+, Lo−) to produce an output signal (Out+, Out−), the balanced mixer circuit comprising:

a mixer means having a plurality of switches for switching the first differential radio frequency signal at the rate of the second differential local oscillator signal;

a pair of transconductance amplifiers differentially coupled to each other for coupling the first pair of differential inputs (RF+, RF−) of the balanced mixer circuit to the mixer means; and a pair of feedback circuits each having a current source and an active component coupled to each of the pair of transconductance amplifiers for forcing the amplifiers to operate more linearly in order to improve intermodulation performance of the balanced mixer without degrading the noise figure.

6. The mixer circuit of claim 5, wherein the mixer means comprises balanced mixer means.

7. The mixer circuit of claim 5, wherein the balanced mixer means includes a doubly-balanced mixer.

8. The mixer circuit of claim 5, wherein the balanced mixer means includes a triply-balanced mixer.

9. The balanced mixer circuit of claim 5, further including a biasing means for biasing the transconductance amplifiers and the mixer means.

* * * * *